United States Patent

Nguyen et al.

[11] Patent Number: 5,603,090
[45] Date of Patent: Feb. 11, 1997

[54] AUTOMATIC CHANNEL IDENTIFICATION

[75] Inventors: Tuan K. Nguyen; Haruo Yamada; Kazuyuki Mori, all of Tokyo; Hiroshi Takahashi, Kawagoe; Asao Hirano, Hatogaya, all of Japan

[73] Assignee: Motorola, Inc., Schaumburg, Ill.

[21] Appl. No.: 270,287

[22] Filed: Jul. 5, 1994

[51] Int. Cl.⁶ ........................... H04B 1/16
[52] U.S. Cl. ............ 455/54.1; 455/38.4; 455/158.2; 455/186.1
[58] Field of Search ................ 455/33.1, 33.2, 455/54.1, 145, 154.1, 154.2, 158.1, 158.2, 185.1, 186.1, 38.1, 38.4, 34.1; 340/311.1, 825.49, 825.44; 379/60, 354, 355

[56] References Cited

U.S. PATENT DOCUMENTS

| | | | |
|---|---|---|---|
| 4,853,688 | 8/1989 | Andros et al. | 340/825.44 |
| 4,891,638 | 1/1990 | Davis | 455/34.1 |
| 5,196,842 | 3/1993 | Gomez et al. | 340/825.44 |
| 5,254,986 | 10/1993 | DeLuca | 340/311.1 |
| 5,280,516 | 1/1994 | Jang | 379/355 |
| 5,305,466 | 4/1994 | Taketsugu | 455/33.1 |
| 5,428,666 | 6/1995 | Fyfe et al. | 455/54.1 |

FOREIGN PATENT DOCUMENTS

| | | | |
|---|---|---|---|
| 0131131 | 6/1991 | Japan | 455/33.1 |

*Primary Examiner*—Reinhard J. Eisenzopf
*Assistant Examiner*—Doris To
*Attorney, Agent, or Firm*—Kelly A. Gardner

[57] ABSTRACT

A method for tracking, in a roaming receiver, RF channels in a multi-area system where each area has a unique RF channel and each unique RF channel has a unique address for each user. A plurality of telephone area codes are stored into a memory of the receiver with each of the telephone area codes corresponding to a different RF channel within the multi-area system. An address from the RF channel which is unique to the receiver for that specific RF channel is received by the receiver, each address corresponding to one of the stored telephone area codes. A telephone area code corresponding to the address is then retrieved from the receiver memory, and the telephone area code is displayed in a receiver display to allow a user to quickly recognize which area of the multi-area system the receiver is located within.

2 Claims, 1 Drawing Sheet

AUTOMATIC CHANNEL IDENTIFICATION

FIELD OF THE INVENTION

This invention relates in general to an RF receiver, and more specifically, to an RF receiver which tracks movement from one area to another in a multi-area RF system and displays to the user a readily recognized code indicative of the area which the RF receiver is currently operating in.

BACKGROUND OF THE INVENTION

Many RF receivers today, such as pagers, operate in multi-area systems which allow a user to pass from one area to another area while using the same receiver. These areas each have their own unique RF channels, and each channel has a unique address and telephone number assigned to each user. Therefore, as a user passes from one area into another area of a multi-area system, the receiver must begin receiving the new channel associated with the new area. The telephone number addressing the receiver may change in the new area and the address for the user in the protocol for the new RF channel will be different from that of the old RF channel address. Most often, a change in area and telephone number will mean a change in the telephone area code.

Receivers for multi-area systems are designed to show a given code indicating which area the receiver is operating in. Generally, the code and the frequency of the receiver are changed manually when the user moves from one area of operation to another. The user may have difficulty remembering which code displayed by the receiver corresponds to which area. What is preferred, then, is to have a receiver that will recognize when a new channel is selected (and corresponding area entered) and automatically signal the user using a code easily understood by the user.

SUMMARY OF THE INVENTION

Accordingly, the present invention provides a method for tracking, in a roaming receiver, RF channels in a multi-area system where each area has a unique RF channel and each unique RF channel has a unique address for each user. A plurality of telephone area codes are stored into a memory of the receiver with each of the telephone area codes corresponding to a different RF channel within the multi-area system. An address from the RF channel which is unique to the receiver for that specific RF channel is received by the receiver, each address corresponding to one of the stored telephone area codes. A telephone area code corresponding to the address is then retrieved from the receiver memory, and the telephone area code is displayed in a receiver display to allow a user to quickly recognize which area of the multi-area system the receiver is located within.

DETAILED DESCRIPTION OF THE INVENTION

Users of telephones, which includes most people in advanced nations, will recognize that area codes are indicative of different populated areas. When a user of a receiver moves from one heavily populated area to another, the area code generally changes. This change in area code frequently corresponds to a change in service area for the receiver, such as for paging receivers. A good example of a change in area codes corresponding to change in areas is Japan where the density of people is high requiring a frequent change in area codes. For instance, Tokyo proper will have a specific area code (e.g. 03), but the suburbs of Tokyo, themselves being heavily populated, have separate area codes (e.g. 0489). The commute between the two, however, is quite short and a user of a receiver such as a pager may travel through several different area codes in a single day. This problem, though certainly prevalent in Japan, is not necessarily unique to Japan but can be found in any heavily populated area where there is a high density of people.

For illustration purposes, pagers will be used to describe the invention throughout this description. However, the invention extends to any multi-area RF system receivers.

Most pagers used in today's multi-area paging systems use a simple code indicating which area the user is in. Generally, the user must manually change the pager to the appropriate code when moving into a new area. For instance, moving from Tokyo to Yokohama, though a short distance apart, requires the user to change from one area code to another. This change is done manually by the user. If the user forgets to make the change, the receiver will not pick up the pages and messages will be missed. To further complicate the situation, the display will show such simple codes as "ch1" representing a first RF channel, and "ch2" representing a second. With several channels, the user may not remember which channel belongs to which area.

To resolve the problem of user memory, both in changing channels and forgetting what the associated code is, the present invention provides a receiver that automatically discriminates between areas/RF channels and displays to the user the associated area code number.

Figure 1:
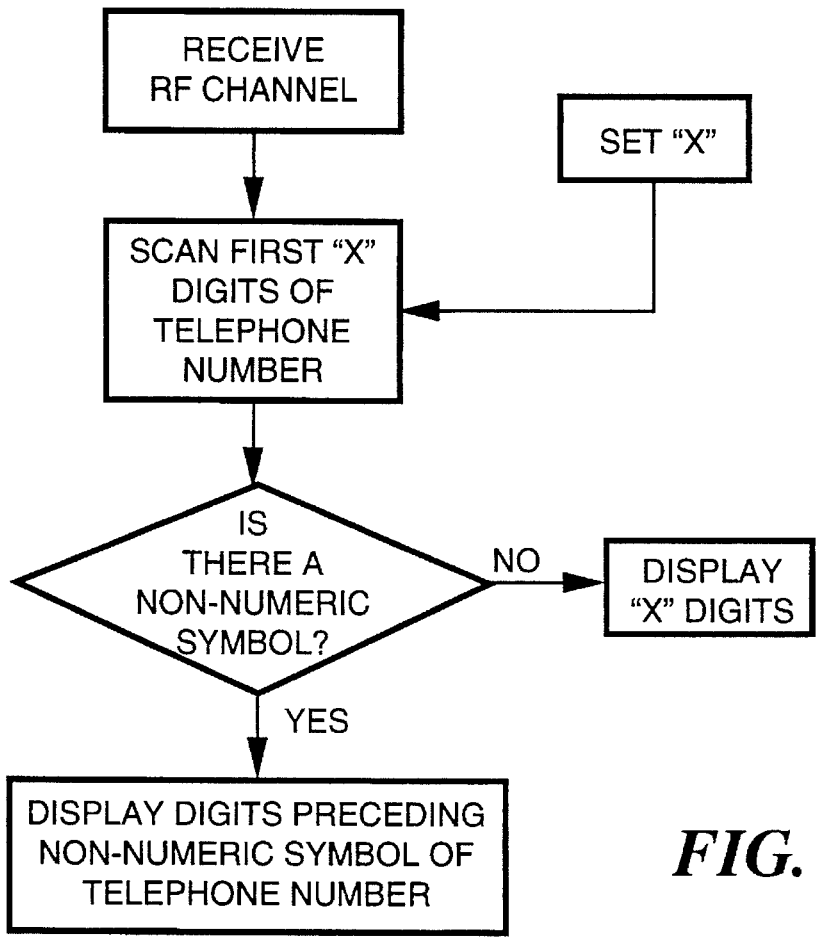
FIG. 1 shows a flow chart of a receiver automatically determining what RF channel the receiver is operating in according to the present invention.
Figure 2:
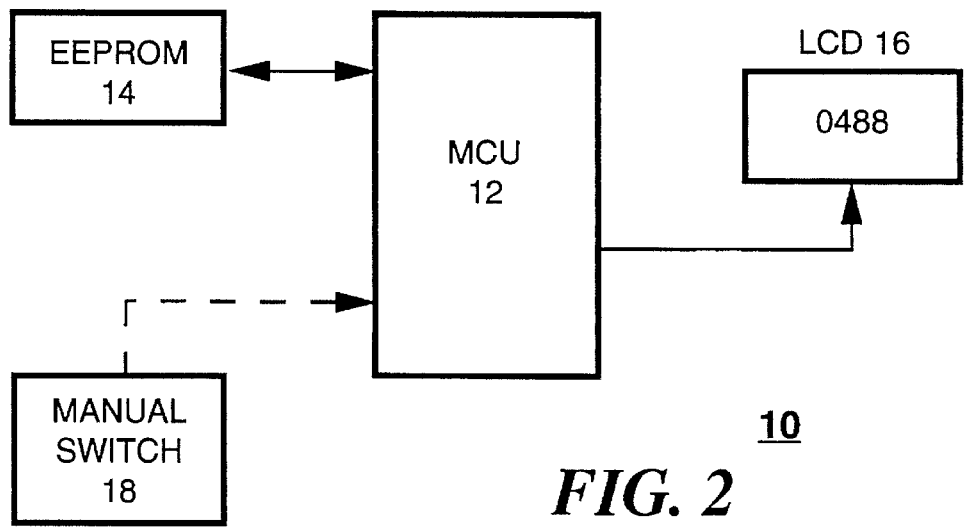
FIG. 2 shows a simple schematic of the receiver according to the present invention.

FIG. 1 diagrams a method followed by a receiver according to the present invention to both determine the RF channel in a given area of a multi-area system, and to display the appropriate area code. A receiver will, at given frequent intervals, sample the incoming RF signal protocol (1). AS the receiver moves into a different area, the protocol will have a different code for the address. The receiver has each address for each area stored in memory. Referring to FIG. 2, as the signal is sampled by receiver 10, a Microcontroller unit (MCU) 12 will sample the protocol address location and check the address with the addresses stored in EEPROM 14 to retrieve an associated telephone number also stored in EEPROM 14. Again in FIG. 1, MCU 12 will scan the first "x" digits of the telephone number. The number "x" may be any set number and may be changed depending upon the number of units in each area code in a given multi-area system. For instance, in the Tokyo region, area codes can have two to four digits. Accordingly, "x" would be set at five.

Next, MCU 12 determines if, within any of the five digits scanned, there is a non-numeric digit in the code such as a blank, "—", or a "/". If so, MCU 12 will recognize the first such non-numeric digit as separating the area code from the prefix of the telephone number. If there is a non-numeric digit, MCU 12 will display (in LCD display 16 of FIG. 2) the digits in the address which immediately precede the non-numeric digit. The display, then, is the area code of the telephone number stored in EEPROM 14 and associated with the RF channel protocol address.

If there is not a non-numeric symbol, MCU 12 will choose to display in LCD 16 the first "x" digits, also representing the area code of the current area.

Where it is not necessary to snore the entire telephone number, the area code for each RF channel may be stored in EEPROM 14. Then, when the new area RF channel is received with its address, MCU 12 pulls the area code from EEPROM 14 associated with the new address and displays it in LCD 16. A search for non-numeric digits becomes unnecessary.

It is also possible to incorporate a manual channel selection switch 18 in receiver 10. A manual channel selection switch 18 would allow the user to scroll through the telephone numbers stored within EEPROM 14 to select a desired area code. However, the most simple process is for receiver 10 to track the change of RF channels automatically.

By using the methods taught in the present invention, a user of a receiver such as a pager may move from area to area in a multi-area RF system without having to worry about manually changing the RF channel code each time. The receiver automatically makes the change for the user. Confusion is also avoided through the teachings of the present invention by displaying the actual telephone area code instead of some representative code that may be forgotten.

We claim:

1. A method for tracking, in a roaming receiver, RF channels in a multi-area system where each area has a unique RF channel and each unique RF channel has a unique address for each user, the method comprising the steps of:

storing a plurality of telephone numbers into a memory of the receiver, each of the telephone numbers corresponding to a different RF channel within the multi-area system;

receiving an address from one of the RF channels which said address is unique to the receiver for that specific RF channel, each said address unique to the receiver corresponding to one of the stored plurality of telephone numbers;

retrieving from the receiver memory one of the telephone numbers corresponding to the address;

scanning a plurality of digits of the one of the telephone numbers;

checking for a non-numeric digit within the scanned plurality of digits; and displaying in a display all digits of the plurality of digits previous in sequence to the non-numeric digit if the non-numeric digit is found to allow a user to quickly recognize which area of the multi-area system the receiver is located within.

2. A method for tracking, in said roaming receiver, said RF channels in said multi-area system according to claim 5 further comprising the step of displaying in the display all scanned plurality of digits if the non-numeric digit is not found.

* * * * *